(12) United States Patent
Okawa et al.

(10) Patent No.: US 11,346,738 B2
(45) Date of Patent: May 31, 2022

(54) PRESSURE SENSOR HAVING A CAP BEING ATTACHED TO THE SUBSTRATE SURFACE WITH AN ADHESIVE

(71) Applicant: Alps Alpine Co., Ltd., Tokyo (JP)

(72) Inventors: Hisanobu Okawa, Miyagi-ken (JP); Hisayuki Yazawa, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 17/004,208

(22) Filed: Aug. 27, 2020

(65) Prior Publication Data

US 2020/0393318 A1 Dec. 17, 2020

Related U.S. Application Data

(63) Continuation of application No. PCT/JP2019/007737, filed on Feb. 28, 2019.

(30) Foreign Application Priority Data

Mar. 20, 2018 (JP) .............................. JP2018-051979

(51) Int. Cl.
*G01L 19/14* (2006.01)
*G01L 9/00* (2006.01)

(52) U.S. Cl.
CPC ............ *G01L 19/14* (2013.01); *G01L 9/0041* (2013.01)

(58) Field of Classification Search
None
See application file for complete search history.

(56) References Cited

U.S. PATENT DOCUMENTS

| 5,750,899 A * | 5/1998 | Hegner ................. G01L 9/0075 73/706 |
| 5,852,320 A | 12/1998 | Ichihashi |
| 10,551,261 B2 * | 2/2020 | Romo ................... G01L 19/147 |
| 10,890,502 B2 * | 1/2021 | Miyake ................. G01L 19/142 |

(Continued)

FOREIGN PATENT DOCUMENTS

| JP | 6-186104 | 7/1994 |
| JP | H09-199864 | 7/1997 |

(Continued)

OTHER PUBLICATIONS

International Search Report from corresponding International Application No. PCT/JP2019/007737, 5pgs, dated Mar. 26, 2019.

*Primary Examiner* — Peter J Macchiarolo
*Assistant Examiner* — Jermaine L Jenkins
(74) *Attorney, Agent, or Firm* — Crowell & Moring LLP

(57) ABSTRACT

A pressure sensor includes a pressure detection element; a substrate on which the pressure detection element is mounted; and a cap in a tubular shape, the cap being attached to the attachment surface of the substrate with an adhesive, the attachment surface enclosing the periphery of the pressure detection element. An attracting concave part is in the end face of the cap, the end face facing the attachment surface, so as to have an inclined surface the distance of which from the attachment surface is increased in a direction from the outer circumferential surface of the cap toward its inner circumferential surface. Part of the adhesive is embedded in the interior of the attracting concave part.

9 Claims, 6 Drawing Sheets

(56) References Cited

U.S. PATENT DOCUMENTS

| | | | |
|---|---|---|---|
| 2006/0075821 A1* | 4/2006 | Otsuka | G01L 19/0645 |
| | | | 73/715 |
| 2007/0210392 A1 | 9/2007 | Sakakibara et al. | |
| 2012/0042734 A1 | 2/2012 | Wade et al. | |
| 2018/0003582 A1* | 1/2018 | Panhoelzl | G01L 19/0069 |

FOREIGN PATENT DOCUMENTS

| | | |
|---|---|---|
| JP | H09-222372 | 8/1997 |
| JP | 2000-206137 | 7/2000 |
| JP | 2007-199049 | 8/2007 |
| JP | 2012-21923 | 2/2012 |
| JP | 2013-167468 | 8/2013 |
| JP | 2014-228295 | 12/2014 |
| JP | 2015-090318 | 5/2015 |

* cited by examiner

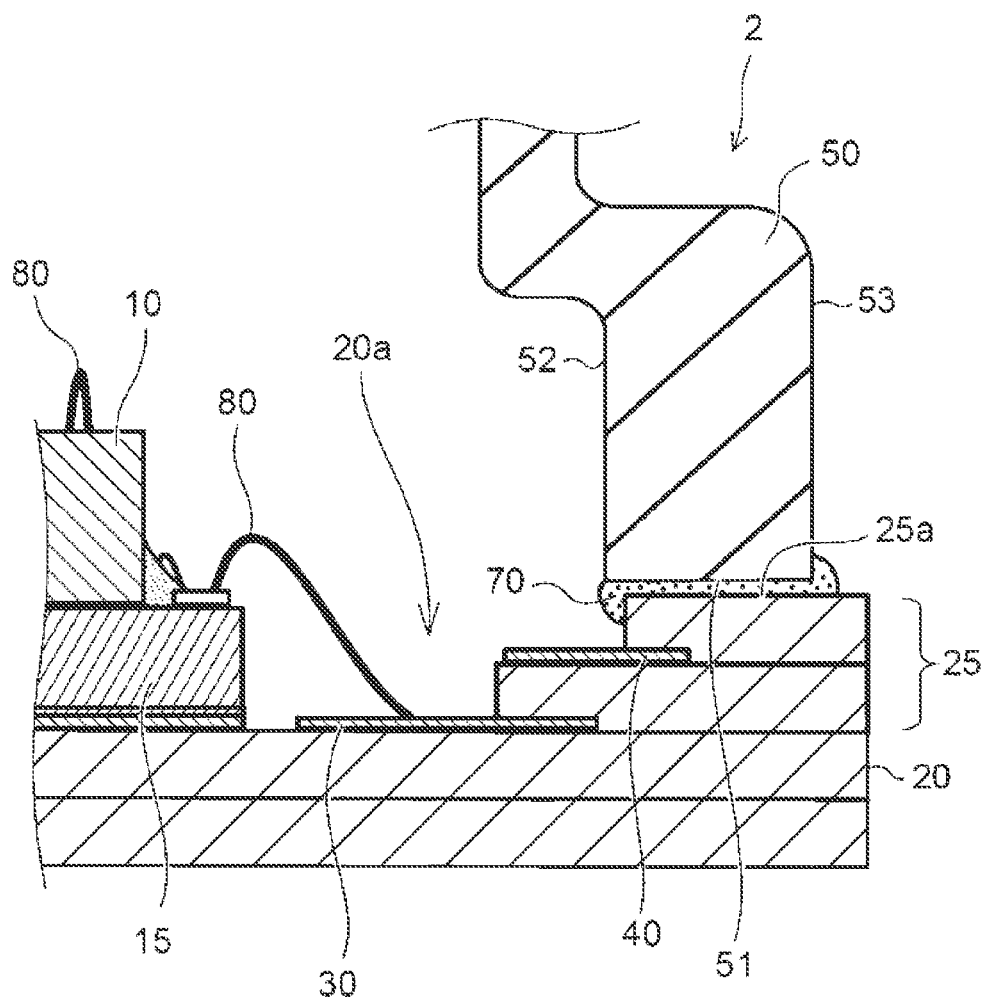

PRESSURE SENSOR HAVING A CAP BEING ATTACHED TO THE SUBSTRATE SURFACE WITH AN ADHESIVE

CLAIM OF PRIORITY

This application is a Continuation of International Application No. PCT/JP2019/007737 filed on Feb. 28, 2019, which claims benefit of priority to Japanese Patent Application No. 2018-051979 filed on Mar. 20, 2018. The entire contents of each application noted above are hereby incorporated by reference.

BACKGROUND

1. Field of the Disclosure

The present disclosure relates to a pressure sensor, and more particularly to a pressure sensor in which the periphery of a pressure detection element is covered by a tubular cap.

2. Description of the Related Art

There has been a recent growing demand for high precision in pressure sensors. In response, sensors have been developed where the periphery of a pressure detection element in some pressure sensors is covered by a tubular cap. Japanese Unexamined Patent Application Publication No. 2000-206137 discloses a structure in which, to prevent an adhesive from entering the interior when a case and cap are joined together, the cap is tapered so that its thickness is reduced toward the end.

Japanese Unexamined Patent Application Publication No. 2013-167468 discloses a structure in which, to prevent an adhesive from covering a pressure introducing hole, the side surface of the adhesive part has a tapered shape.

Japanese Unexamined Patent Application Publication No. 2015-090318 discloses a structure in which, to prevent an adhesive from adhering to a sensor during the bonding of a sleeve (frame part) to a circuit board, the inner wall surface of the sleeve is tapered so that the adhesive ascends the inner wall surface.

Japanese Unexamined Patent Application Publication No. 9-199864 discloses a structure in which, to prevent an adhesive from entering the interior of a case structural body that joins an upper case and a lower case together, the lower case is provided with an adhesive storage part and the upper case is provided with a protruding part.

In the structures described in Japanese Unexamined Patent Application Publication Nos. 2000-206137 and 2013-167468, however, when the cap is pressed to attach it, the adhesive may be squeezed out to the outside of the cap. If the adhesive is squeezed out to the outside of the cap, the dimensions of the outside shape cannot be assured. When, for example, the outer circumferential surface of the cap is an attachment reference, the attachment position is varied by the adhesive squeezed out of the cap. If the pressure sensor cannot be attached at the accurate position and at the accurate angle, detection precision is lowered. In the structure described in Japanese Unexamined Patent Application Publication No. 2015-090318, an additional part such as beads is necessary, leading to an obstacle to an improvement in productivity. In the structure described in Japanese Unexamined Patent Application Publication No. 9-199864, the adhesive flows out to the outside of the case.

SUMMARY

The present disclosure provides a pressure sensor that can restrain an adhesive from being is squeezed out to the outside of a cap during the connection of the cap to a substrate with an adhesive.

In one aspect of the present disclosure, a pressure sensor includes: a pressure detection element; a substrate on which the pressure detection element is mounted; and a cap having a tubular shape, the cap being attached to the attachment surface of the substrate with an adhesive, the attachment surface enclosing the periphery of the pressure detection element. An attracting concave part is in the central portion of the end face of the cap, the end face facing the attachment surface, so as to have a portion the distance of which from the attachment surface is increased in a direction from the outer circumferential surface of the cap toward its inner circumferential surface, and that part of the adhesive is embedded in the interior of the attracting concave part.

With this structure, even if the adhesive is spread due to a pressing force to the cap during the attachment of the cap to the substrate with the adhesive, the spread adhesive enters the interior of the attracting concave part. That is, the adhesive is drawn into the interior of the attracting concave part while spreading along the attracting concave part in a direction from the outer circumferential surface of the cap toward its inner circumferential surface, so the adhesive is not squeezed out from the outer circumferential surface of the cap to the outside.

BRIEF DESCRIPTION OF THE DRAWINGS

FIG. 3 is an enlarged cross-sectional view of a portion to which the cap of a pressure sensor in a reference example is attached;

DESCRIPTION OF THE EXEMPLARY EMBODIMENTS

Figure 1A:
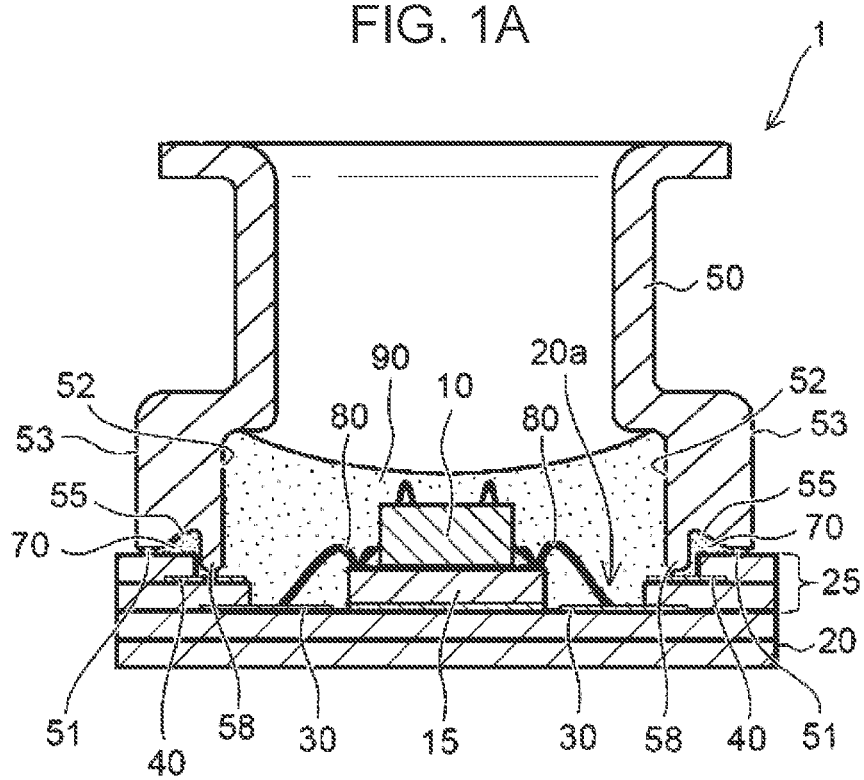
FIGS. 1A and 1B each illustrate the structure of a pressure sensor according to an embodiment of the present invention.

Embodiments of the present invention will be described below with reference to the drawings. In the descriptions below, like members will be denoted by like reference characters and repeated descriptions will be appropriately omitted for members that have been described once.

Structure of a Pressure Sensor

Figure 1B:
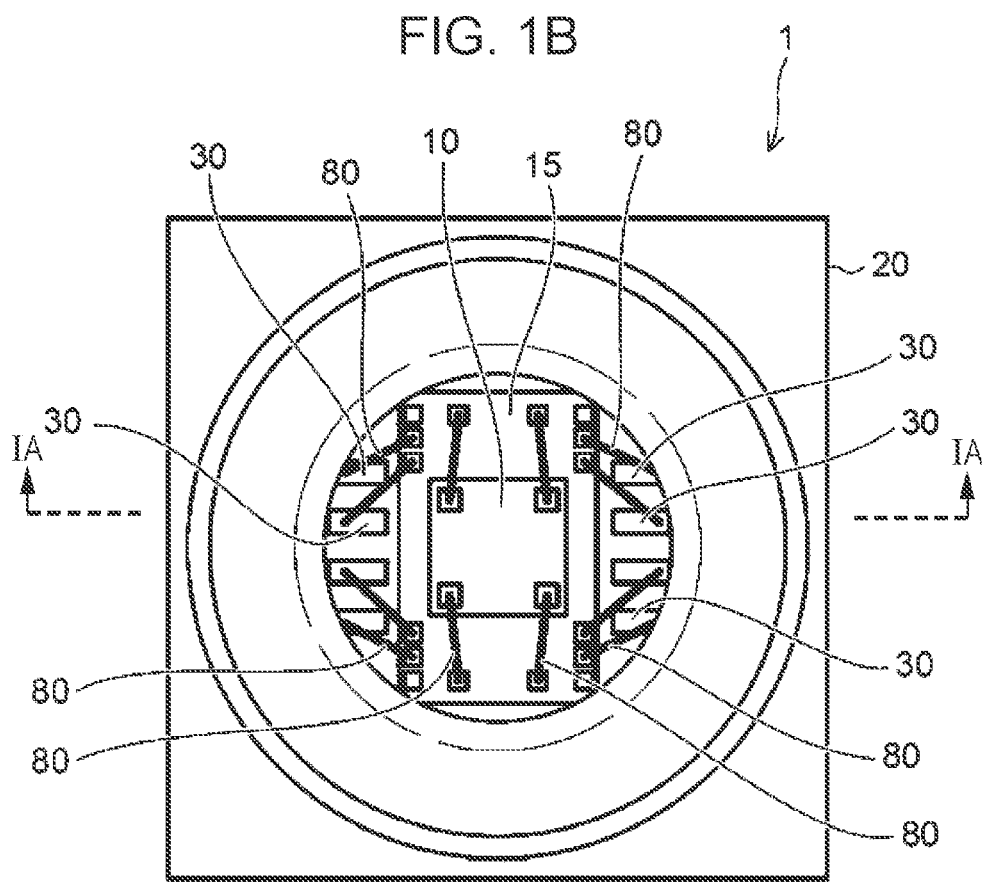

FIGS. 1A and 1B each illustrate the structure of a pressure sensor according to an embodiment.

FIG. 1A is a cross-sectional view of the pressure sensor 1. FIG. 1B is a plan view of the pressure sensor 1. The cross-sectional view in FIG. 1A is taken along line IA-IA in FIG. 1B.

Figure 2:
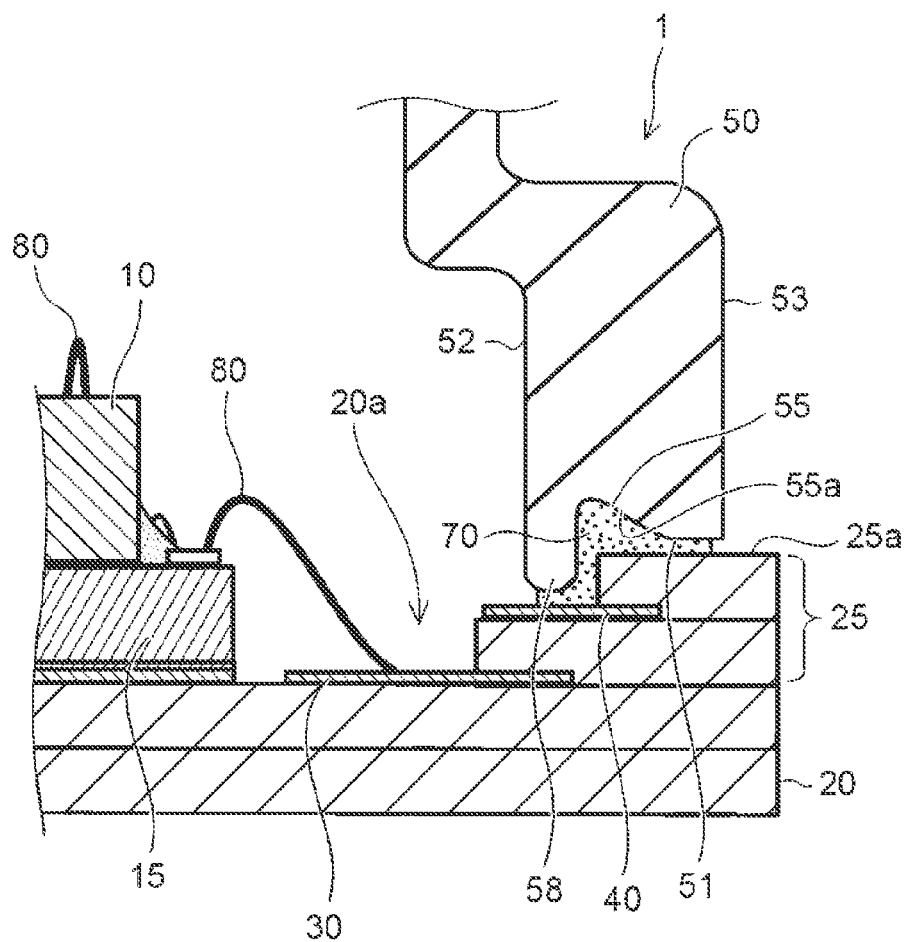
FIG. 2 is an enlarged cross-sectional view of a portion to which a cap is attached.

FIG. 2 is an enlarged cross-sectional view of a portion to which a cap is attached.

As illustrated in FIG. 1, the pressure sensor 1 according to this embodiment detects applied pressure with a pressure detection element 10. The pressure sensor 1 has the pressure detection element 10, a substrate 20 on which the pressure detection element 10 is mounted, and a cap 50, in a tubular shape, that is attached on the substrate 20 with an adhesive 70. The inside (interior of the tube) of the cap 50 is filled with a gel 90, forming the pressure sensor 1 of waterproof type.

The pressure detection element 10 is, for example, a chip part in which a diaphragm is formed in a silicon semiconductor by etching or the like. The substrate 20 is, for example, a laminated substrate of ceramics such as alumina. On the substrate 20, a circuit element 15 is also mounted besides the pressure detection element 10. In this embodiment, the pressure detection element 10 and circuit element 15 are overlaid for compactness. However, the pressure detection element 10 and circuit element 15 may be placed side by side on the substrate 20.

On the substrate 20, pad electrodes 30 and a ground electrode 40 are formed by, for example, metallized patterns. The pressure detection element 10 and circuit element 15 are connected by bonding wires 80. The pressure detection element 10 is also connected to each pad electrode 30 through the circuit element 15 by one bonding wire 80.

The ground electrode 40 is disposed on the substrate 20 so as to enclose the outer sides of the pressure detection element 10 and circuit element 15. The ground electrode 40, which is at ground potential, is disposed at a distance from the pad electrodes 30. In this embodiment, a concave part 20a is formed at a position at which the pressure detection element 10 is placed on the substrate 20. The concave part 20a may be formed by making the central portion of the substrate 20 thinner than the peripheral part. Alternatively, the concave part 20a may be formed by providing a frame part 25 with a predetermined thickness so as to enclose the periphery of the pressure detection element 10. In this embodiment, the frame part 25 is provided on the substrate 20 and the ground electrode 40 is provided on this frame part 25.

The cap 50 is formed from a conductive material such as a metal. The cap 50, which is of tubular type, has an inner circumferential surface 52, an outer circumferential surface 53, and an end face 51 facing the substrate 20. The cap 50 is attached so as to enclose the outer sides of the pressure detection element 10 and circuit element 15 on the substrate 20. In this case, the end face 51 of the cap 50 is attached to the substrate 20 with the adhesive 70. Specifically, the cap 50 is attached with the adhesive 70 so that the end face 51 of the cap 50 and the attachment surface 25a of the frame part 25 on the substrate 20 face each other.

In this embodiment, an attracting concave part 55 is formed in the end face 51 of the cap 50. The attracting concave part 55 is formed so that its end on the same side as the outer circumferential surface 53 of the cap 50 (the side will also be referred to bellow simply as the outer circumferential side) does not reach the outer circumferential surface 53. Therefore, the cap 50 has a surface facing the attachment surface 25a of the frame part 25 on the outer circumferential side of the attracting concave part 55. The attracting concave part 55 has an inclined surface 55a as a portion in which the distance from the attachment surface 25a of the frame part 25 is increased in a direction from the outer circumferential surface 53 of the cap 50 toward the inner circumferential surface 52 (the direction will also be referred to below simply as the inner side direction).

Since this attracting concave part 55 is formed in the end face 51 of the cap 50, even if the adhesive 70 is spread due to a pressing force to the cap 50 during the attachment of the cap 50 to the substrate 20 with the adhesive 70, the spread adhesive 70 is likely to be drawn into the interior of the attracting concave part 55. That is, since the attracting concave part 55 is formed so that the distance of the inclined surface 55a of the attracting concave part 55 from the attachment surface 25a is increased in the inner side direction, pressure between the end face 51 and the attachment surface 25a is lower on the inner side than on the outer side. The adhesive 70 is much more drawn into the interior of the attracting concave part 55 than to the outer side due to the inclination of pressure toward the inner side direction. This more restricts an amount by which the adhesive 70 placed between the attachment surface 25a of the frame part 25 and the end face 51 of the cap 50 spreads to the outer circumferential side than to the attracting concave part 55. As a result, the adhesive 70 spreads without being squeezed out from the outer circumferential surface 53 of the cap 50 to the outside.

The inclined surface 55a of the attracting concave part 55 preferably has a tapered surface or curved surface. Thus, the adhesive 70, which spreads during the attachment of the cap 50, is smoothly drawn into the interior of the attracting concave part 55 along the tapered surface or curved surface of the inclined surface 55a of the attracting concave part 55. Examples of the inclined surface 55a of the attracting concave part 55 includes a surface the distance of which from the attachment surface 25a is increased in the inner side direction (such as a surface in a stepped shape).

On the end face 51, a protruding part 58 may be formed that protrudes from the end face 51 so as to be positioned in the concave part 20a. Thus, during the attachment of the cap 50, the protruding part 58 of the cap 50 fits to the inner side of the frame part 25 and is reliably positioned.

A path into which the adhesive 70 flows is formed between the protruding part 58 and the frame part 25. That is, when the protruding part 58 has been fitted to the inner side of the frame part 25, the end of the protruding part 58 is positioned below the attachment surface 25a of the frame part 25. Thus, the flow-out path of the adhesive 70 in the inner side direction is bent, so space in which the adhesive 70 spreads in the inner side direction is increased when compared with a linear flow-out path. This makes it possible to positively restrain the adhesive 70 from flowing out to the outside.

When the flow-out path of the adhesive 70 is bent, the bonding area can be increased when compared with a linear flow-out path. Therefore, the adhesive 70 preferably has a portion placed between the protruding part 58 of the cap 50 and the inner surface of the concave part 20a of the substrate 20. The adhesive 70 further preferably enters a clearance between the protruding part 58 and the substrate 20 as well. Therefore, when the interior of the cap 50 is filled with the gel 90, it is possible to prevent an area (space) not filled with the gel 90 from being formed between the protruding part 58 and the substrate 20.

The ground electrode 40 may be disposed at a position, on the substrate 20, at which the ground electrode 40 faces the protruding part 58 of the cap 50. Thus, when the cap 50 having conductivity is attached, if the ground electrode 40 and the protruding part 58 of the cap 50 are placed in an electrically continuous state, the cap 50 has ground potential. Therefore, the cap 50 fulfills the role of an electromagnetic shield for the pressure detection element 10 and circuit element 15 enclosed by the cap 50. To place the protruding part 58 and ground electrode 40 in an electrically continuous state, an adhesive having conductivity may be used as the adhesive 70. Alternatively, if an adhesive having non-conductivity is used as the adhesive 70, the protruding part 58 and ground electrode 40 may be in contact with each other.

After the cap 50 having conductivity has been attached, there may be a slight clearance (about several μm to several tens of μm) between the ground electrode 40 and the protruding part 58 of the cap 50. Then, if electrostatic discharge (ESD) occurs, a current can be caused to flow from the cap 50 through this clearance to the ground to protect the pressure detection element 10 and circuit element 15. This can be done as ESD countermeasures.

The end face of the protruding part 58 may be convex toward the substrate 20. Thus, it is possible for the protruding part to be easily inset during the fitting of the protruding part 58 to the inner side of the frame part 25. When the cap 50 has conductivity and the ground electrode 40 is disposed on the substrate 20, an opposing area between the ground electrode 40 and the convex end face of the protruding part 58 is narrowed, enabling ease of discharge to be enhanced in ESD countermeasures.

Reference Example

FIG. 3 is an enlarged cross-sectional view of a portion to which the cap of a pressure sensor in a reference example is attached.

In the pressure sensor 2 in the reference example, the frame part 25 and the end face 51 of the cap 50 on the same side as the substrate 20 face each other, and the cap 50 is attached with the adhesive 70. Since the end face 51 and the attachment surface 25a of the frame part 25 are flat, the adhesive 70 between the end face 51 and the attachment surface 25a spreads both inwardly and outwardly due to a force with which the cap 50 is pressed.

Figure 4A:
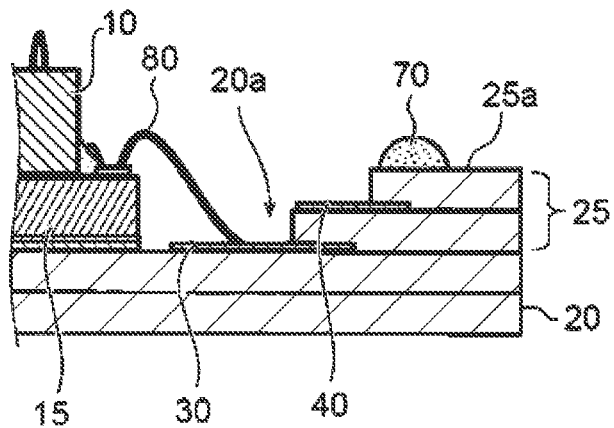
FIGS. 4A to 4C are schematic cross-sectional views illustrating states in which an adhesive spreads during the attachment of the cap of the pressure sensor in the reference example.
Figure 4B:
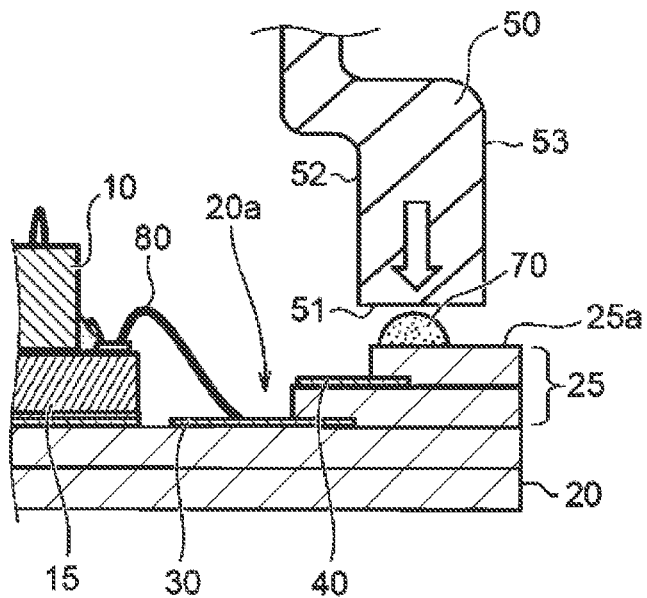
Figure 4C:
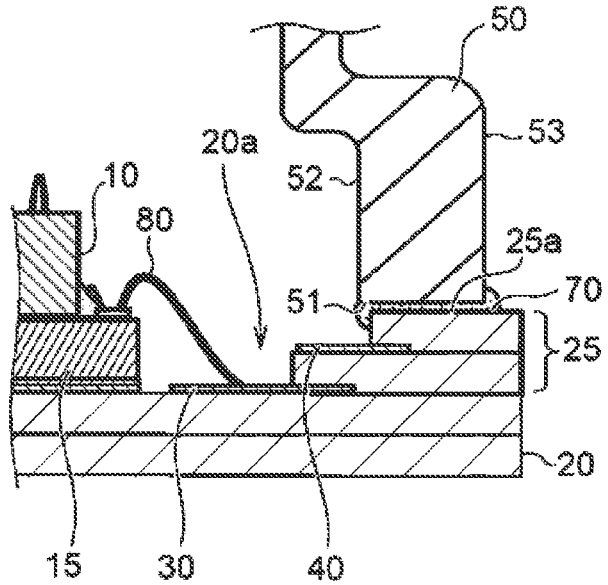

FIGS. 4A to 4C are schematic cross-sectional views illustrating states in which an adhesive spreads during the attachment of the cap of the pressure sensor in the reference example.

First, the adhesive 70 is applied to the attachment surface 25a of the frame part 25 as illustrated in FIG. 4A. Next, the cap 50 is placed on the frame part 25 as illustrated in FIG. 4B. In this case, the cap 50 is pressed toward the frame part 25 in such a way that the end face 51 of the cap 50 and the attachment surface 25a of the frame part 25 face each other.

When the cap 50 is pressed, the adhesive 70 is crushed between the end face 51 of the cap 50 and the attachment surface 25a of the frame part 25 and spreads both inwardly and outwardly, as illustrated in FIG. 4C. The adhesive 70 is applied with a certain extra amount so that the adhesive 70 spreads to the whole (entire circumference) of the end face 51 and attachment surface 25a without a clearance being left. Therefore, the extra amount of adhesive 70 is squeezed out of both the inner circumferential surface 52 and outer circumferential surface 53 of the cap 50.

Figure 5A:
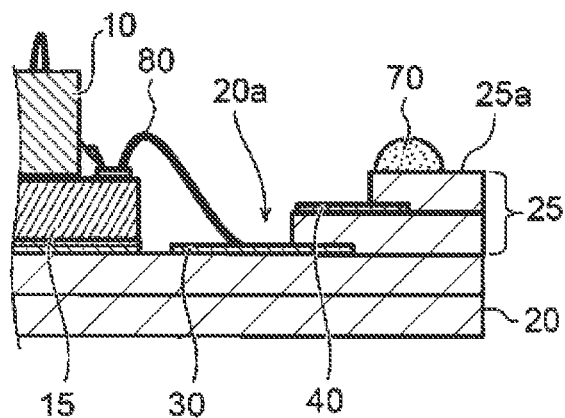
FIGS. 5A to 5C are schematic cross-sectional views illustrating states in which an adhesive spreads during the attachment of the cap of the pressure sensor in the embodiment of the present invention.
Figure 5B:
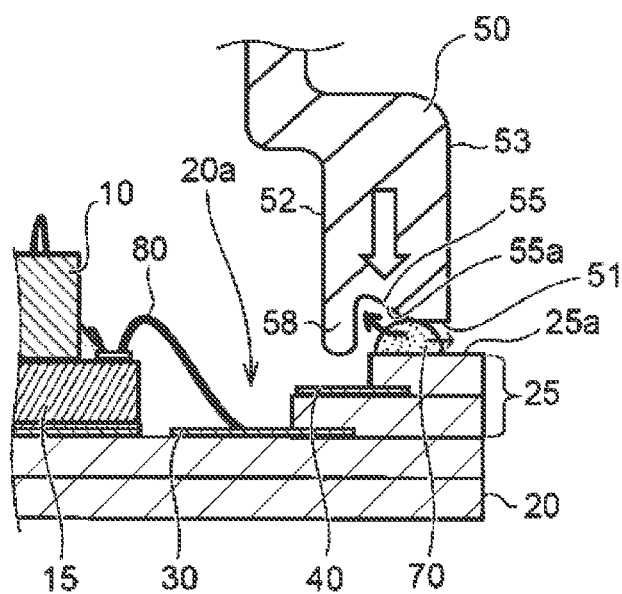
Figure 5C:
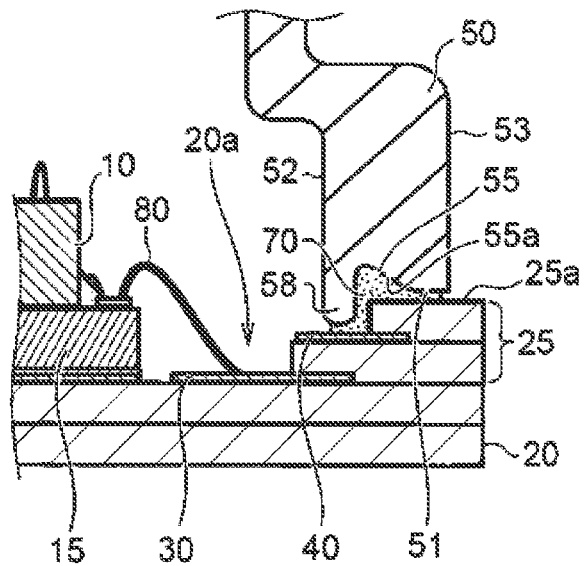

FIGS. 5A to 5C are schematic cross-sectional views illustrating states in which an adhesive spreads during the attachment of the cap of the pressure sensor in this embodiment.

First, the adhesive 70 is applied to the attachment surface 25a of the frame part 25 as illustrated in FIG. 5A. The adhesive 70 is applied as in the reference example (see FIG. 4A).

Next, the cap 50 is placed on the frame part 25 as illustrated in FIG. 5B. In this case, the protruding part 58 of the cap 50 is fitted to the inner side of the frame part 25. Then, the cap 50 is pressed toward the frame part 25 in such a way that the end face 51 of the cap 50 and the attachment surface 25a of the frame part 25 face each other.

When the cap 50 is pressed, the adhesive 70 is crushed between the end face 51 of the cap 50 and the attachment surface 25a of the frame part 25 and spreads. In this case, since, in this embodiment, the attracting concave part 55 is formed in the end face 51, the adhesive 70, which would otherwise spread, is drawn to the interior of the attracting concave part 55 toward the inner direction.

When the cap 50 is further pressed, the protruding part 58 is fitted to the inner side of the frame part 25, and the adhesive 70 squeezed out of the attracting concave part 55 enters the clearance between the protruding part 58 and the inner circumferential surface of the frame part 25 and the clearance between the substrate 20 and the end of the protruding part 58, as illustrated in FIG. 5C. Since the attracting concave part 55 like this is formed, the adhesive 70 is preferentially embedded in the interior of the attracting concave part 55. Therefore, the amount of adhesive 70 spreading to the outer circumferential side is more restricted than the amount of adhesive 70 spreading to the attracting concave part 55. Therefore, even if the adhesive 70 spreads, it is not squeezed out from the outer circumferential surface 53 of the cap 50 to the outside. Also, since the cap 50 has the protruding part 58, the bonding area between the cap 50 and the frame part 25 can be increased and the cap 50 can thereby be stably fixed by the frame part 25.

Figure 6A:
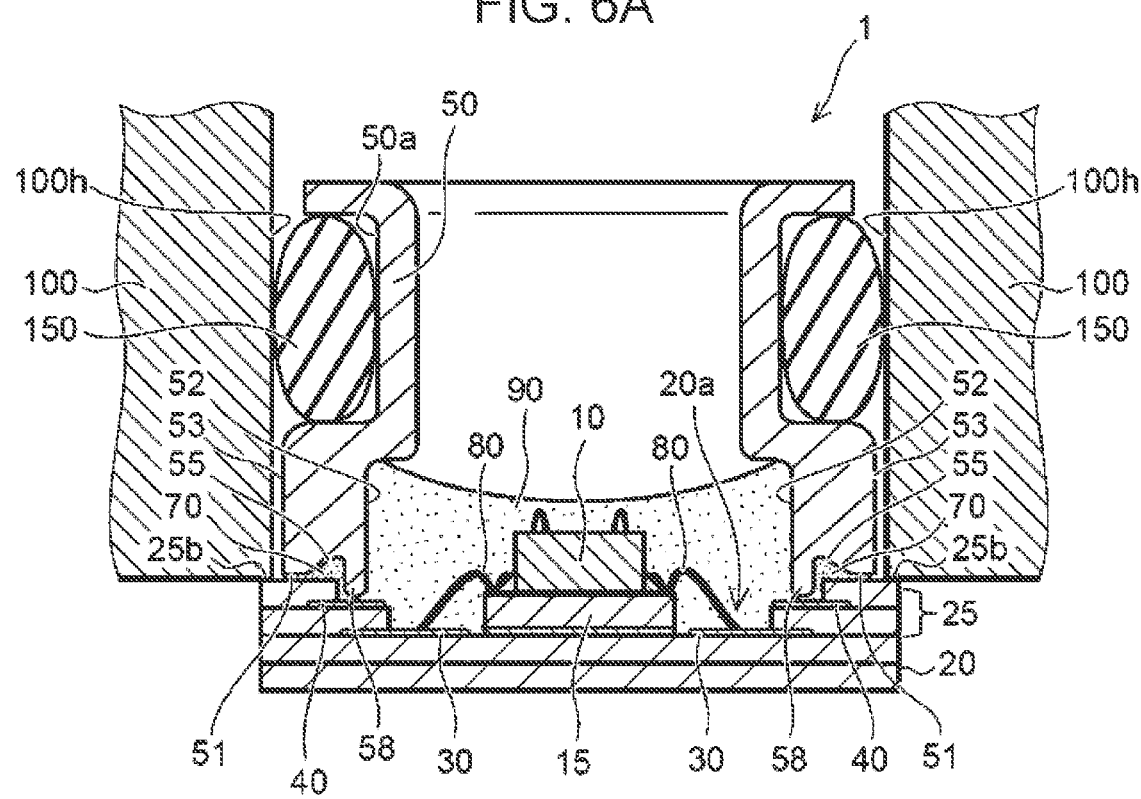
FIG. 6A is a cross-sectional view illustrating a state in which the pressure sensor according to the embodiment of the present invention is attached to a case.

As described above, with the pressure sensor 1 according to this embodiment, the adhesive 70 is not squeezed out from the outer circumferential surface 53 of the cap 50 to the outside. The outer circumferential surface 53 of the cap 50 and the surface 25b of the frame part 25 each become a reference surface for the attachment of the pressure sensor 1. Therefore, when the pressure sensor 1 according to this embodiment is inserted into an attachment hole 100h in a case 100 as illustrated in FIG. 6A, the cap 50 is appropriately fitted to the attachment hole 100h. When the cap 50 is fitted in this way, the pressure sensor 1 is attached at the accurate position and at the accurate angle with respect to the outer circumferential surface 53 and the surface 25b of the frame part 25, so detection precision can be appropriately assured. Since airproofing by a sealing material 150, such as an O-ring, provided on the narrowed part 50a of the cap 50 is also appropriately performed, the waterproof property is less likely to be lowered at the portion to which the pressure sensor 1 is attached.

However, if the adhesive 70 is squeezed out of the outer circumferential surface 53 of the cap 50, when the pressure sensor is inserted into the attachment hole 100h in the case 100 with respect to the outer circumferential surface 53, the adhesive 70 squeezed out to the outer circumferential surface 53 may make it difficult for the cap 50 to enter the attachment hole 100h. If the cap 50 is forcedly pressed into the attachment hole 100h in this state, the cap 50 may be damaged.

Figure 6B:
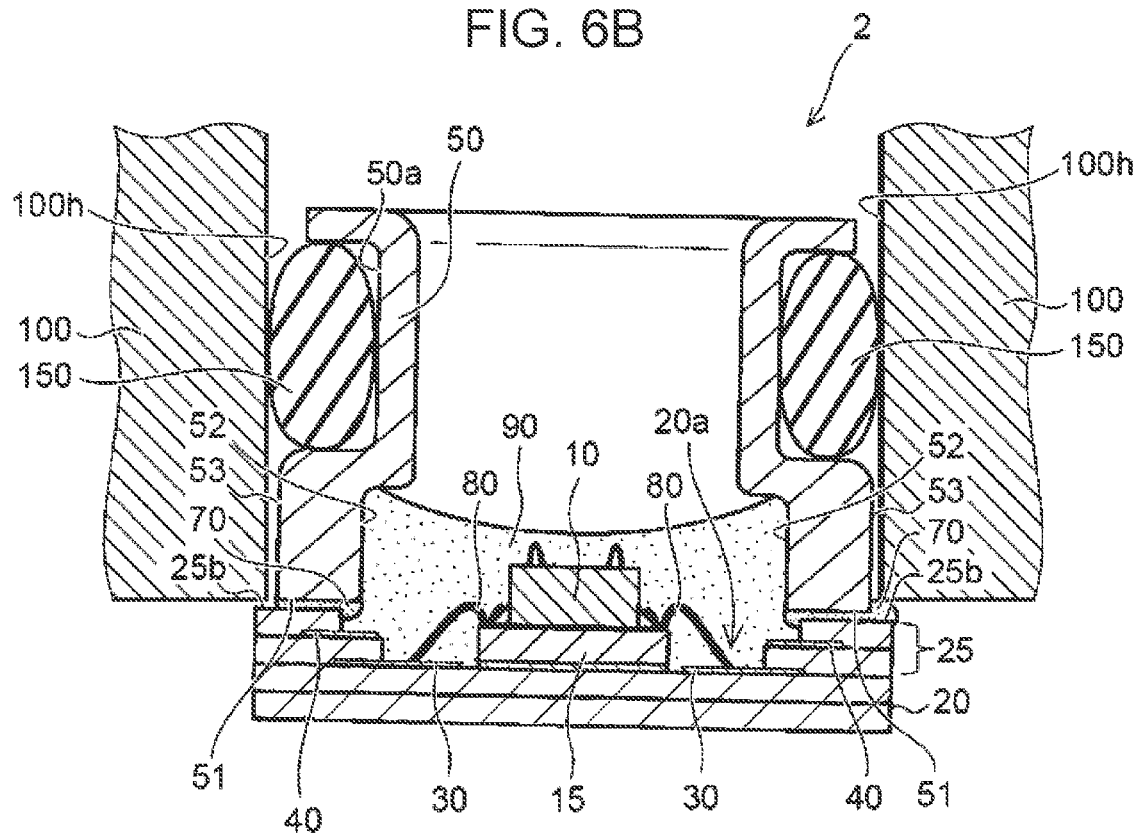
FIG. 6B is a cross-sectional view illustrating a state in which the pressure sensor in the reference example is attached to a case

As in the pressure sensor 2, illustrated in FIG. 6B, in the reference example, when the cap 50 is inserted into the attachment hole 100h, a clearance may be left between the case 100 and the surface 25b of the frame part 25 in the attached pressure sensor 2 due to the adhesive 70 squeezed out of part of the outer circumferential surface 53. In this case, the pressure sensor 2 is placed at a position deviating from the position at which the pressure sensor 2 is originally attached. This may lower the detection precision of the sensor. Another problem is that since the outer circumferential surface 53 is attached so that the cap 50 is at an oblique angle with respect to the attachment hole 100h, airproofing by the sealing material 150, such as an O-ring, disposed on the narrowed part 50a of the cap 50 may be less likely to be appropriately performed. If airproofing by the sealing material 150 is inadequate, the waterproof property is lowered and moisture is likely to pass beyond the sealing material 150 from the outside and intrude. The moisture that has passed beyond the sealing material 150 and has intruded may further enter the interior from the clearance between the case 100 and the surface 25b of the frame part 25 in the pressure sensor 2. Then, the moisture may cause an operation failure in the device to which the pressure sensor 2 is attached.

Even if the adhesive 70 is not squeezed out of the outer circumferential surface 53 of the cap 50 to the extent illustrated in FIG. 6B, when the adhesive 70 that has been squeezed out is placed between the attachment hole 100h and the outer circumferential surface 53 of the cap 50, the fitting between the attachment hole 100h and the outer circumferential surface 53 may not appropriately performed. In this case, since the positioning of the pressure sensor 2 is with respect to the outer circumferential surface 53 and attachment hole 100h, the pressure sensor 2 is placed at a position deviating from the intended position. This deviation in placement may cause the detection precision of the pressure sensor 2 to drop. Thus, when the adhesive 70 is squeezed out of the outer circumferential surface 53 of the cap 50, the adhesive 70 becomes the cause of various problems such as breakage of the cap 50, a drop in the detection precision of the pressure sensor 2, and a drop in the waterproof property at the portion to which the pressure sensor 2 is attached.

As described above, according to this embodiment, it is possible to restrain the adhesive 70 from being squeezed out from the outer circumferential surface 53 of the cap 50 to the outside during the connection of the cap 50 to the substrate 20 with the adhesive 70. Thus, it becomes possible to attach the pressure sensor 1 at the accurate position and at the accurate angle with respect to the outer circumferential surface 53 of the cap 50. With the pressure sensor 1 according to this embodiment, therefore, a drop in detection precision due to an attachment failure is less likely to occur, and the possibility is also appropriately suppressed that a fatal problem, such as breakage of the pressure sensor 1 or an operation failure in a device due to a drop in the waterproof property, occurs.

So far, this embodiment has been described above. However, the present invention is not limited to the examples in the embodiment. The scope of the present invention also includes embodiments obtained as a result of appropriately adding or deleting constituent elements to or from the embodiment described above, performing design changes to the embodiment, or appropriately combining features in the examples in the structures in the embodiment as long as the obtained embodiments are within the intended scope of the present invention; the additions, deletions, design changes, or combination is effected by a person having ordinary skill in the art.

What is claimed is:

1. A pressure sensor comprising:
a pressure detection element;
a substrate on which the pressure detection element is mounted, the substrate having a concave part in which the pressure detection element is placed; and
a cap having a tubular shape, the cap being attached to an attachment surface of the substrate with an adhesive, the attachment surface enclosing a periphery of the pressure detection element; wherein:
an attracting concave part is in an end face of the cap, the end face facing the attachment surface, so as to have a portion a distance of which from the attachment surface is increased in a direction from an outer circumferential surface of the cap toward an inner circumferential surface of the cap,
part of the adhesive is embedded in an interior of the attracting concave part,
the attachment surface is formed around the concave part; and
the cap has a protruding part that protrudes from the end face so as to be positioned in the concave part.

2. The pressure sensor according to claim 1, wherein the attracting concave part has a tapered surface.

3. The pressure sensor according to claim 1, wherein the attracting concave part has a curved surface.

4. The pressure sensor according to claim 1, wherein:
the cap has conductivity; and
a ground electrode at ground potential is provided on the substrate.

5. The pressure sensor according to claim 4, wherein a surface of the protruding part, the surface facing the substrate, is convex toward the substrate.

6. The pressure sensor according to claim 5, wherein the adhesive has a portion embedded into a clearance between the protruding part and the substrate.

7. The pressure sensor according to claim 5, further comprising a ground electrode at ground potential, the ground electrode being disposed on the substrate, wherein:
the cap has conductivity;
the adhesive is non-conductive; and
the protruding part and the ground electrode are in contact with each other.

8. The pressure sensor according to claim 5, further comprising a ground electrode at ground potential, the ground electrode being disposed on the substrate, wherein:
the cap has conductivity;
the adhesive is non-conductive; and
there is a clearance between the protruding part and the ground electrode.

9. The pressure sensor according to claim 1, wherein:
the cap has conductivity; and
the adhesive has conductivity.

* * * * *